United States Patent [19]
Fonash et al.

[11] Patent Number: 5,994,164
[45] Date of Patent: Nov. 30, 1999

[54] NANOSTRUCTURE TAILORING OF MATERIAL PROPERTIES USING CONTROLLED CRYSTALLIZATION

[75] Inventors: Stephen J. Fonash; A. Kaan Kalkan, both of State College, Pa.

[73] Assignee: The Penn State Research Foundation, University Park, Pa.

[21] Appl. No.: 09/040,554

[22] Filed: Mar. 18, 1998

Related U.S. Application Data

[60] Provisional application No. 60/040,817, Mar. 18, 1997.

[51] Int. Cl.$^6$ .................................. H01L 21/322
[52] U.S. Cl. ..................... 438/97; 438/162; 438/166; 438/486; 438/487; 438/488
[58] Field of Search ..................... 438/486, 487, 438/488, 684, 96, 97, 162, 166; 117/8

[56] References Cited

U.S. PATENT DOCUMENTS

| | | | |
|---|---|---|---|
| 4,177,084 | 12/1979 | Lau et al. ..................... | 117/8 |
| 4,490,573 | 12/1984 | Gibbons ..................... | 136/255 |
| 4,786,608 | 11/1988 | Griffith ..................... | 438/766 |
| 5,147,826 | 9/1992 | Lin et al. ..................... | 438/486 |
| 5,275,851 | 1/1994 | Fonash et al. ..................... | 438/479 |
| 5,365,875 | 11/1994 | Asai et al. ..................... | 438/487 |
| 5,366,926 | 11/1994 | Mei et al. ..................... | 438/487 |
| 5,543,352 | 8/1996 | Ohtani et al. ..................... | 438/487 |
| 5,574,293 | 11/1996 | Arai et al. ..................... | 438/59 |
| 5,585,291 | 12/1996 | Ohtani et al. ..................... | 438/486 |
| 5,643,826 | 7/1997 | Ohtani et al. ..................... | 438/162 |
| 5,654,203 | 8/1997 | Ohtani et al. ..................... | 438/97 |
| 5,744,824 | 4/1998 | Kousai et al. ..................... | 257/74 |
| 5,773,329 | 6/1998 | Kuo ..................... | 438/162 |
| 5,837,569 | 11/1998 | Makita et al. ..................... | 438/166 |
| 5,897,347 | 4/1999 | Yamazaki et al. ..................... | 438/166 |

OTHER PUBLICATIONS

An article by Meier et al., entitled On The Way Towards High Efficient Thin Film Silicon Solar Cells by the "Micromorph" Concept, Mat. Rex. Soc. Symp. Proc., 420, 3 (1996).

An article by Kuhl et al., entitled Optical Investigation of Different Silicon Films, J.Electrochem.Soc., 121, 1496 (1974).

An article by Iqbal et al., entitled Optical Absorption in Hydrogenated Microcrystalline Silicon, J. Phys. C., 16, 2005 (1983).

An article by Richter et al, entitled Optical Properties and Transport in Microcrystalline Silicon Prepared at Temperatures Below 400° C., J, Appl. Phys., 52, 7281 (1981).

An article by Beck et al., entitled Enhanced Optical Absorption in Microcrystalline Silicon, J. Non–Cryst. Solids, 198–200, 903–906 (1996).

An article by Meier et al., entitled Complete Microcrystalline P–I–N Solar Cell–Crystalline or Amorphous Cell Behavior?, Appl. Phys. Lett. 65(7) (1994).

*Primary Examiner*—Robert Kunemund
*Assistant Examiner*—Donald L. Champagne
*Attorney, Agent, or Firm*—Thomas J. Monahan

[57] ABSTRACT

The present invention is generally related to controllably modifying or tailoring the structure of crystalline films to adjust and enhance the material properties of the film, such as optical, mechanical and electrical properties. Crystalline films generally refer to microcrystalline ($\mu c$) film, nanocrystalline (nc) film, polycrystalline (poly-c) film, and other crystallized films. The present invention provides a method for controllably obtaining desired grain sizes (or crystal sizes) in crystalline films and for controllably providing a predominance of grains sizes in a predetermined range to adjust and enhance the optical absorption properties of the crystalline film. The present invention also provide a method for controlling the mechanical properties, e.g., stress formation levels, during crystallization of at least a portion of the precursor film. Through control of the stress formation levels, it is possible to controllably adjust and enhance the electrical properties (e.g., doping efficiencies, carrier mobility, Fermi level and minority carrier lifetimes) of the crystallized portion.

14 Claims, 11 Drawing Sheets

Absorption spectra of μc-Si films of various grain sizes obtained by SPC. For comparision the absorption coefficients of the precursor a-Si:H film and single crystalline Si is also included. Δ is the grain size and the data have been smoothed to remove interference effects.

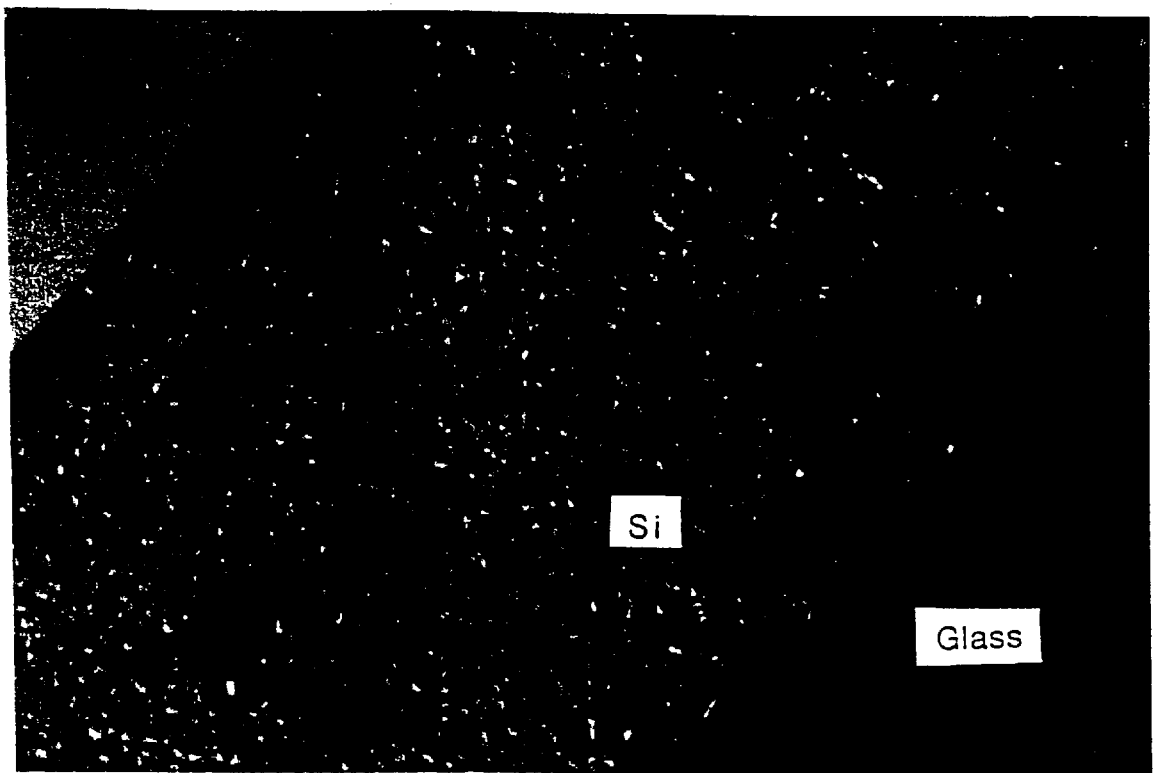
Figure 1 (a)  Cross sectional TEM micrograph of our ~100 Å grain size poly-Si film after a magnification of 177,000 times.

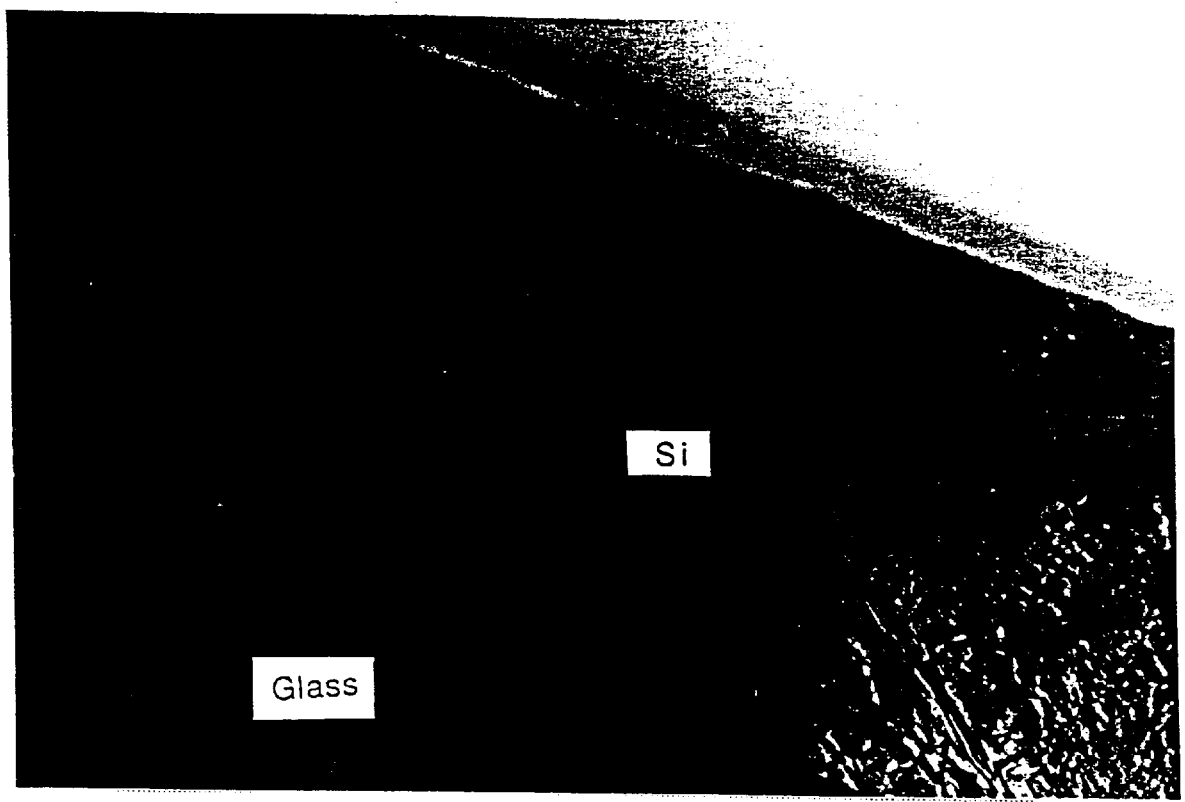
Figure 1 (b) Cross sectional TEM micrograph of our ~1 μm grain size poly-Si film after a magnification of 130,000 times.

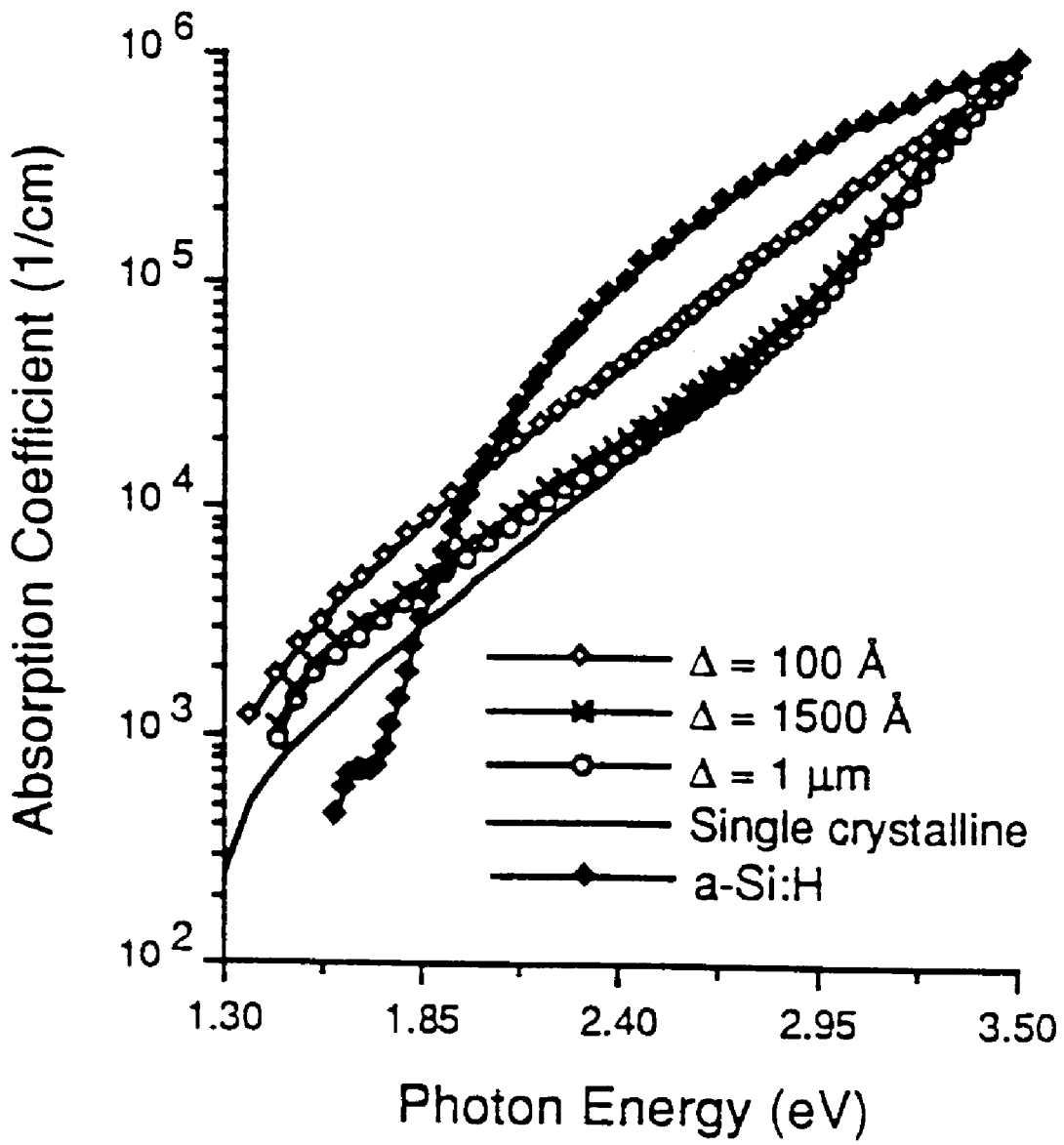
Figure 2. Absorption spectra of μc-Si films of various grain sizes obtained by SPC. For comparision the absorption coefficients of the precursor a-Si:H film and single crystalline Si is also included. Δ is the grain size and the data have been smoothed to remove interference effects.

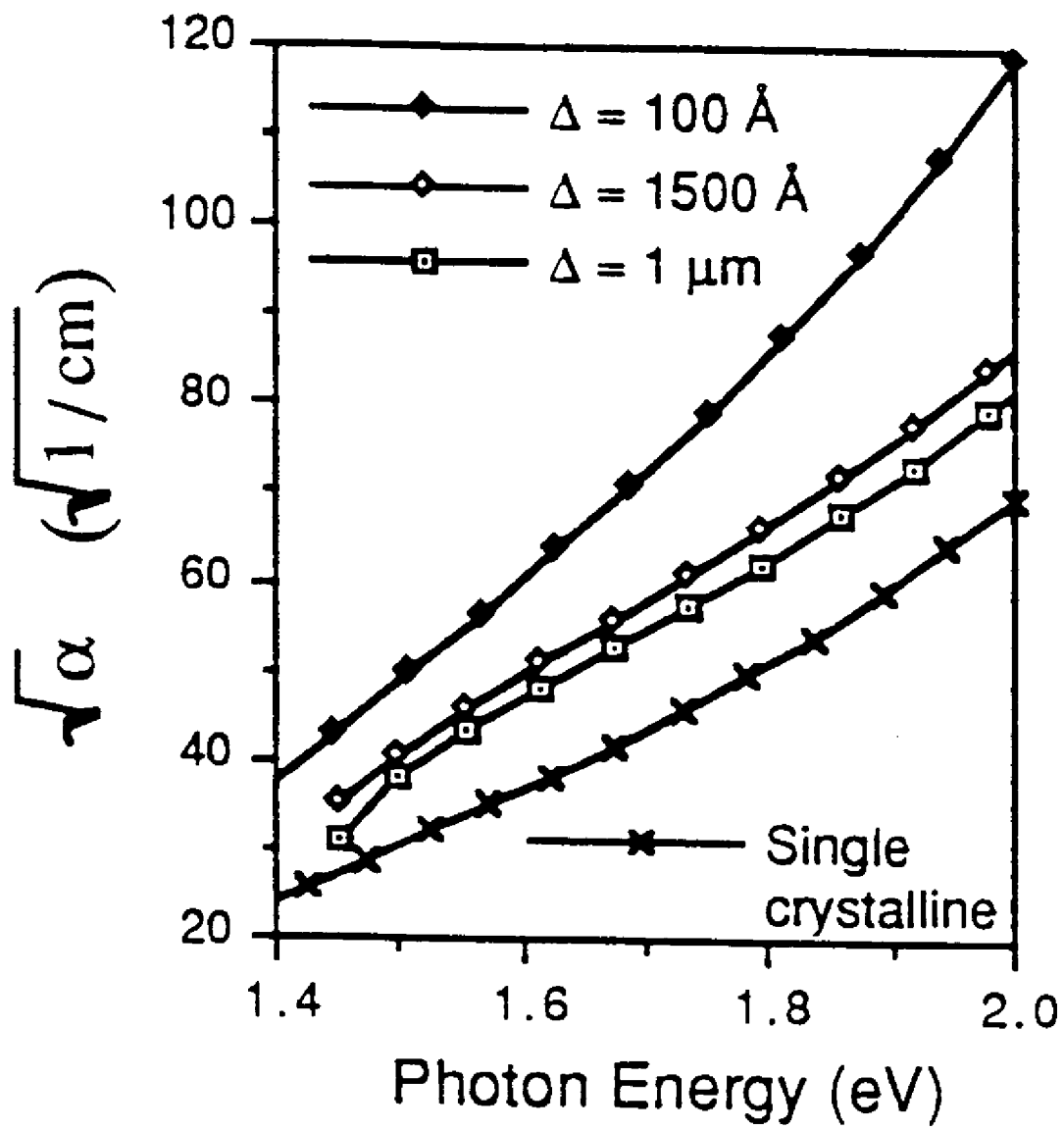
Figure 3. Squareroot of the absorption coefficient versus photon energy. Δ is the grain size.

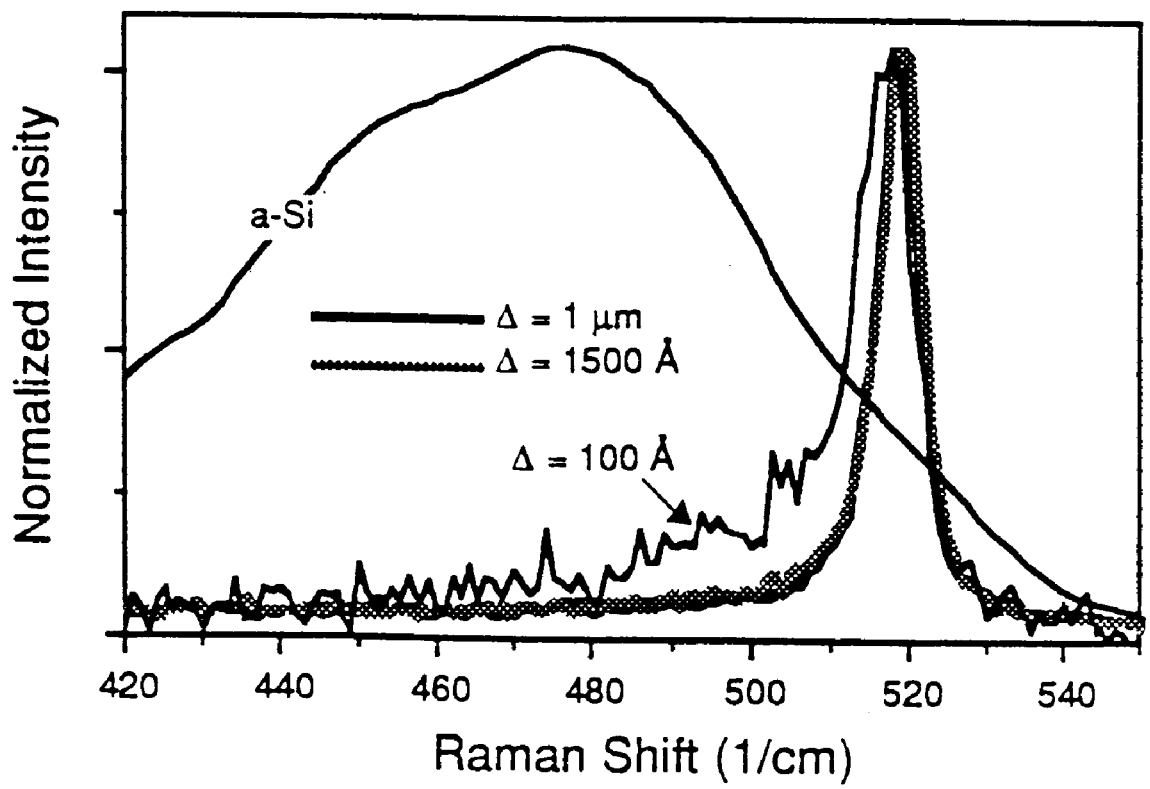
Figure 4. Normalized Raman spectra from our films, where Δ is the grain size. The spectrum for the a-Si precursor is smoothened by curve fitting before plotted.

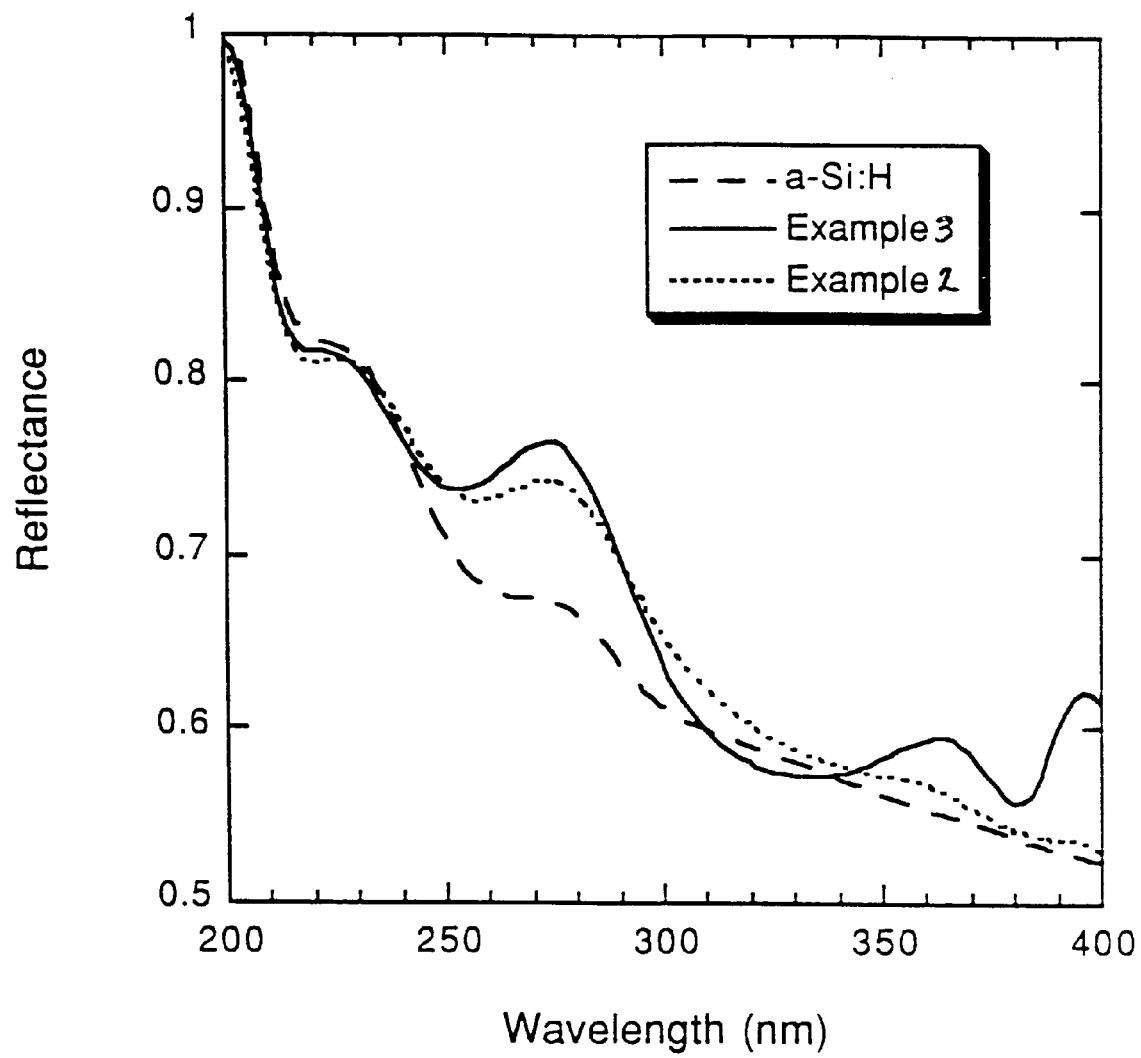
Figure 5. UV reflectance for the fully crystallized films obtained by annealing at 600 °C in 10 minutes (example 2) and 5 minutes (example 3) after surface treatments with pallamerse and nickel-chloride, respectively.

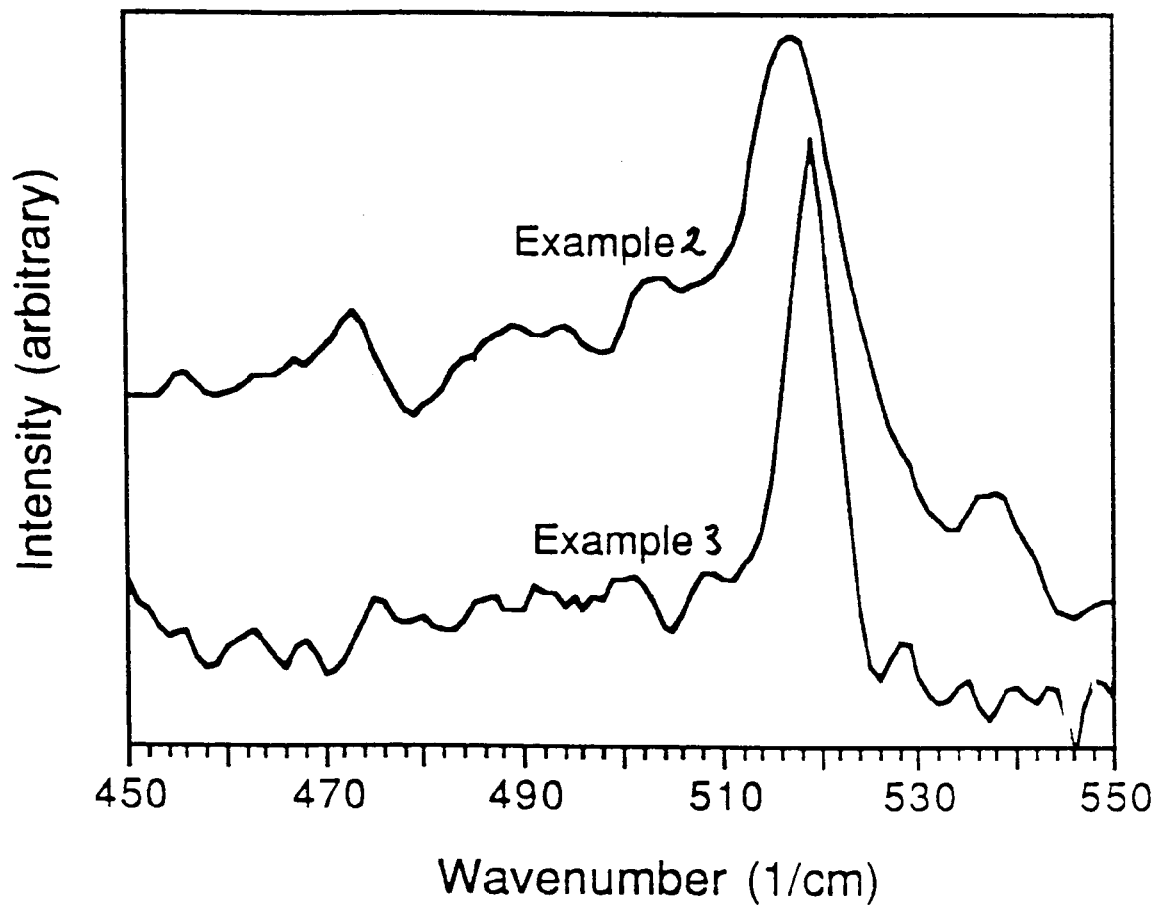
Figure 6. Raman Spectra of the films crystallized as in example 2 and example 3.

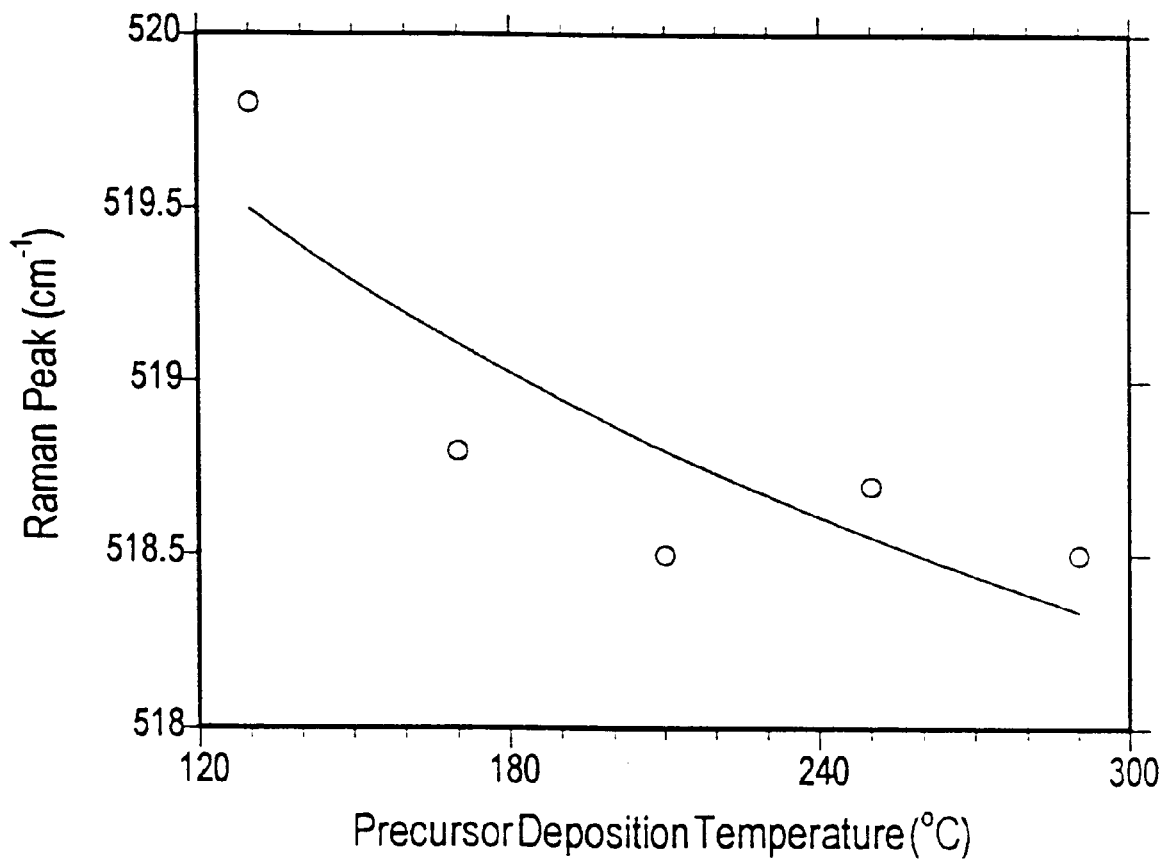
Figure 7. Shift of first order Raman peak for the SPC poly-Si films with the precursor deposition temperature.

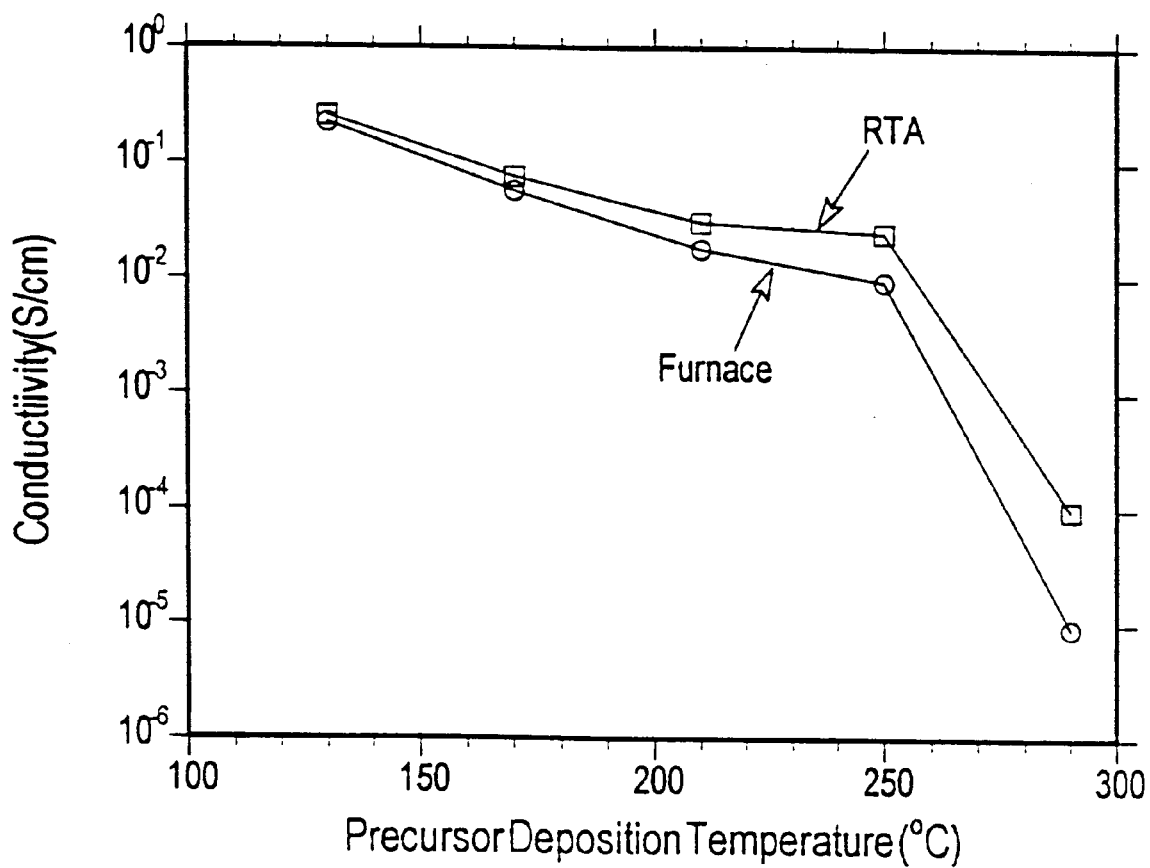
Figure 8.a. Dark conductivity of SPC poly-Si films crystallized from precursors deposited at various temperatures which were P-implanted prior to crystallization.

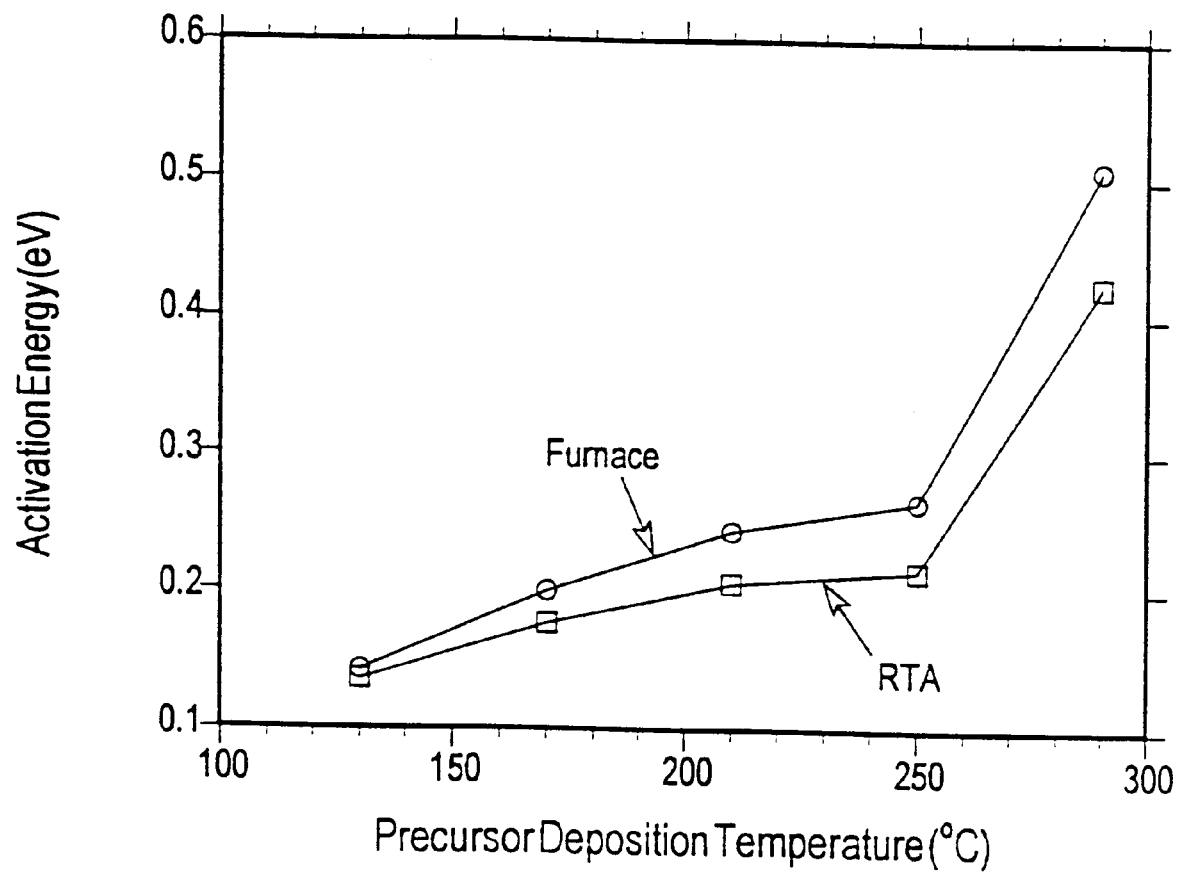
Figure 8.b. Activation energy (for dark conductivity) of SPC poly-Si films crystallized from precursors deposited at various temperatures which were P-implanted prior to crystallization.

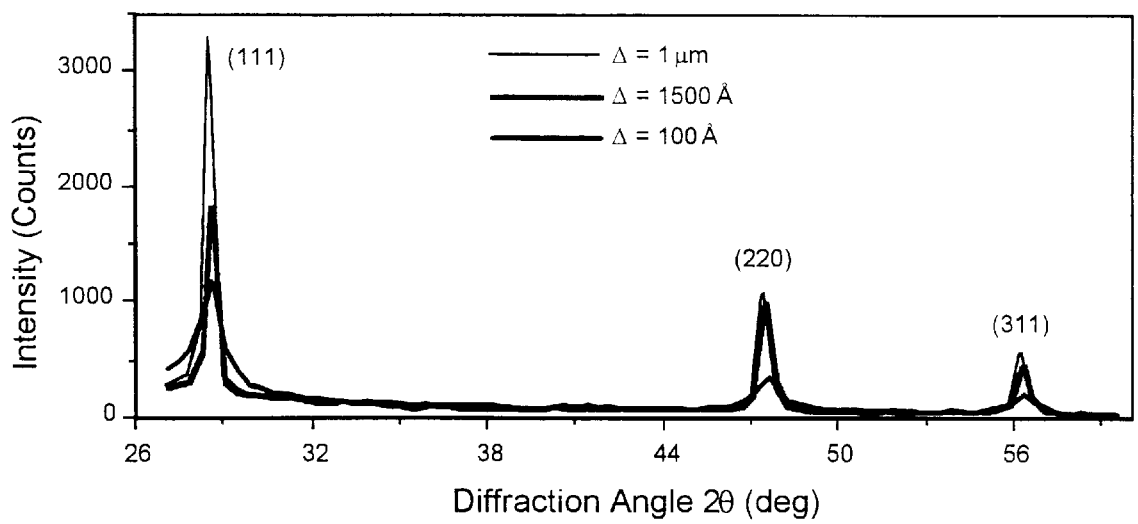
Figure 9 XRD pattern for our μc-Si films of various grain sizes. Here, Δ denotes the grain size.

NANOSTRUCTURE TAILORING OF MATERIAL PROPERTIES USING CONTROLLED CRYSTALLIZATION

This application claims the priority from U.S. Provisional Application No. 60/040,817 filed Mar. 18, 1997, which application is incorporated by reference herein.

FIELD OF THE INVENTION

The present invention relates to a method for tailoring the nanostructure of crystalline silicon films to control their optical, mechanical and electrical properties.

BACKGROUND OF THE INVENTION

Polycrystalline (poly-Si) thin films are conventionally obtained by plasma deposition, solid phase crystallization (SPC), or liquid phase crystallization. Recent advancements in polycrystalline silicon (poly-Si) thin film technology have reduced the time, annealing temperature and overall costs of fabricating such thin films. For example, U.S. Pat. No. 5,147,826 (Lin et al.) and U.S. Pat. No. 5,275,851 (Fonash et al.) are directed to low temperature crystallization and patterning of a-Si films through the deposition of a nucleating site material on either a substrate or the a-Si film. U.S. Pat. Nos. 5,543,352; 5,585,291; 5,643,826 and 5,654,203 to Ohtani et al. are directed a method for manufacturing semiconductor devices with a crystalline silicon layer. U.S. Pat. Nos. 5,543,352, 5,643,826 and 5,654,203 describe the deposition of a solution containing a catalyst in contact with an a-Si film and the crystallization of the a-Si film at a relatively low temperature. U.S. Pat. No. 5,585,291 describes a crystallization method in which a crystallization promoting material is mixed within a liquid precursor material for forming silicon oxide and the precursor material is then coated onto an amorphous silicon film. These advancements in poly-Si technology have made it more cost effective to produce poly-Si films.

Polycrystalline silicon is known to be used in a variety of applications and technologies, such as in infra-red filters, absorbers in solar cells, active mechanical parts in microelectromechanical systems (MEMS), channel layers in transistors, and active layers in sensor structures. In these applications, the poly-Si is in thin film form, e.g., the film is deposited on some substrate in thickness ranging from tens of nanometers (nm) to micrometers ($\mu$m). In all these applications, the optical, mechanical or electrical properties or perhaps all three of the poly-Si are being used. Depending on the application, it can be very advantageous to tailor the properties of the thin film poly-Si.

For instance, amorphous silicon (a-Si) is currently known to be used to fabricate large area and low cost systems, such as solar cells and flat panel displays. However, it is possible to employ poly-Si thin films to fabricate three dimensional (3-D) microelectronics and large area, relatively inexpensive electronic systems, at low processing temperatures. That is, poly-Si films provide even higher carrier mobility, doping efficiency and stability, than a-Si. Thus, poly-Si thin films can be used in an increasing number of industries and applications, provided that such thin films can be fabricated with suitable material properties.

The majority of solar cells are presently based on bulk cast poly-Si, which is expensive to produce. A major problem with using poly-Si thin films (instead of bulk cast poly-Si) in solar cells is their low efficiency in absorbing light, since crystalline silicon is an indirect bandgap semiconductor. As such, bulk single crystalline or bulk cast poly-Si solar cells, typically hundreds of microns thick, must be employed to absorb most of the sunlight. However, employing thicker poly-Si thin films will obviate the cost advantage provided by the thin film approach. Moreover, a poly-Si thin film exhibits more defects than bulk poly-Si due to its smaller grain size and denser intra-grain defects. The higher defect density of poly-Si thin film causes a shortened minority carrier diffusion or drift length for the collection of photo-generated carriers. Consequently, if thin film poly-Si solar cells are to be efficient, they must be thin enough (e.g., tens of microns or less) for effective photo-carrier collection and must absorb sunlight, thus requiring some type of light trapping capability.

One approach to enhance the amount of light absorption in a thin film poly-Si cell is to utilize a textured surface. However, such an approach is costly, as it requires additional processing steps and processing time.

Alternatively, enhanced absorption properties of as-deposited microcrystalline Si have been shown to be advantageous in solar cells by the researchers from Institute de Microtechnique, Neuchatel, Switzerland (J. Meier et al., Mat. Res. Soc. Symp. Proc., 420, 3 (1996)). However, the morphology of their hydrogenated microcrystalline material is assumed to be a composition of crystalline grains (160 to 170 Å) embedded in a matrix of a-Si. Since a-Si acts like a direct bandgap semiconductor, it has a much stronger absorption above the bandgap than crystalline silicon. Thus, enhanced absorption behavior of the as-deposited microcrystalline silicon was not (and could not be) attributed in those works to the crystalline phase alone. Furthermore, a correlation with grain size was not reported, and the enhanced light absorption was considered to be due to light scattering from the grain boundaries.

Accordingly, there is a need to provide a method for systematically increasing the optical absorption properties of poly-Si thin films. There is a further need to provide a method for selectively controlling and adjusting the optical absorption properties of poly-Si thin films.

Furthermore, there is an increasing need to enhance the mechanical and electrical properties of poly-Si thin films. Poly-Si thin films are conventionally obtained by plasma deposition, solid phase crystallization (SPC), or liquid phase crystallization. Plasma deposition of thin film poly-Si yields a low density of defects due to in situ hydrogen passivation during the process. However, poly-Si films deposited by plasma enhanced chemical vapor deposition (PECVD) were found to posses smaller grain sizes and certain amorphous content, which limit carrier mobility (J. Meier et al., Mat. Res. Soc. Symp. Proc., 420, 3 (1996)). Unlike for a-Si films, the deposition rate for poly-Si films is very low. Although SPC yields the largest grain sizes and the highest crystallinity, the presence of high density of intra-grain defects in SPC poly-Si limits its use. The intra-grain defects can be passivated by a hydrogen plasma exposure after crystallization; however, post hydrogenation was found to lead to electronic instability (V. Suntharalingam et al., Appl. Phys. Lett., 68, 1400 (1996)). Thus, there is a need to provide a method for controllably adjusting and enhancing the mechanical and electrical properties of crystalline films.

Accordingly, it is an object of the present invention to provide a method for tailoring the material properties of crystalline thin films, such as their optical, mechanical and electrical properties.

It is a further object of the present invention to provide a method for controllably obtaining desired grain sizes for crystalline thin films.

It is also an object of the present invention to provide a method for controllably adjusting the optical absorption properties of crystalline films and, more specifically, for controllably enhancing the optical absorption properties of such films.

Another object of the present invention is to provide a method for controllably adjusting and enhancing the mechanical properties (e.g., stress state or stress formation levels) of crystalline thin films.

It is another object of the present invention to provide a method for controllably adjusting and enhancing the electrical properties of crystalline thin films, such as enhancing their doping efficiencies, carrier mobility, control of the Fermi level and minority carrier lifetimes carrier mobility.

SUMMARY OF THE INVENTION

The present invention is generally related to controllably modifying or tailoring the nanostructure of crystalline films to adjust and enhance their material properties, such as optical, mechanical and electrical properties. Crystalline films generally refer to microcrystalline ($\mu c$) films, nanocrystalline (nc) films, polycrystalline (poly-c) films, and other crystallized films. In a first embodiment, the present invention provides a method for controllably obtaining desired grain sizes (or crystal sizes) in crystalline films and for controllably providing a predominance of grains sizes in a predetermined range to adjust and enhance the optical absorption properties of the crystalline film. In a second and third embodiment, the present invention is directed to a method for controlling stress formation levels during crystallization of at least a portion of the precursor film and for controlling stress formation levels during crystallization to a predetermined range so as to adjust and enhance the electrical properties (e.g., doping efficiencies, carrier mobility, Fermi level and minority carrier lifetimes) of the crystallized portion.

Turning to the first embodiment, there is provided a method for controllably adjusting the grain size of crystalline films and a method for controllably adjusting or influencing optical absorption properties of crystalline films by controlling their grain size. For example, a crystalline film, e.g., poly-Si film, is provided using solid phase crystallization (SPC), with the grain size of the film controllably adjusted according to a catalyst element (also referred as a nucleating site material), such as Palladium (Pd) and Nickel (Ni). That is, a catalyst element is chosen to provide a predominance of crystal sizes in a semiconductor film within a predetermined range, after the film is subjected to an annealing process.

The present invention further provides a method for selectively controlling the optical absorption properties of crystalline films through the grain size. Through experimentation, it has been discovered that optical absorption properties of crystalline films are related to the grain size of the films, e.g., crystalline films with smaller grain sizes under a threshold value (e.g., about 200 Å) have a greater absorption coefficient and vice-versa. The experiments demonstrate that these modifications can produce substantial changes in the absorption coefficients. The resulting stronger absorption coefficients offer the advantage of using thinner poly-Si films, so that photo-generated carriers can be collected more efficiently.

Thus, the present invention provides a method for selectively controlling or tailoring the nanostructure, particularly the grain size, of crystalline films through the use of selected nucleating site materials, such as Nickel (Ni), Palladium (Pd) and so forth. Alternative approaches are also provided herein for controlling the grain size and, thus, the optical absorption properties of crystalline films. Since acoustic phonon localization is a possible cause of enhanced light absorption in crystalline films, techniques other than grain size control, e.g., ion implantation, can also be introduced to achieve this goal by phonon confinement.

In a second embodiment, the present invention provides methods for controllably adjusting stress formation levels in the formation of crystalline films. It has been discovered that stress formation levels (also referred herein as "stress", "stress state" or "stress levels") of crystalline films may be controlled and adjusted through the use of the following methods: (1) the selection of precursor deposition temperature to control void density in the precursor; (2) the use of an interface coating between the substrate and the film which softens or melts at SPC annealing temperatures, i.e., below the softening temperature of the substrate; (3) the use of metal catalyst surface treatments, particularly the selection of the catalyst; and (4) controlling the precursor film thickness.

In a third embodiment, it has been discovered that intragrain defect formation correlates with the mechanical stress induced during the SPC process, which has been observed to be more severe with thicker films. Thus, minimization of stress formation levels during SPC is required to optimize (e.g., to reduce) the formation of intra-grain defects. Furthermore, mechanical stress is also a problem confronted in MEMS (Micro ElectroMechanical Systems) and must be minimized.

It has also been found that the defect generation in SPC poly-Si films may be significantly reduced by controlling and relieving their stress formation levels during crystallization. Thus, improved electronic quality poly-Si may be achieved for device applications to provide higher doping efficiencies, higher carrier mobility, better control of the Fermi level and longer minority carrier lifetimes.

BRIEF DESCRIPTION OF THE DRAWINGS

FIG. 1A is a cross-sectional transmission electron microscope (TEM) micrograph of a poly-Si film having an approximately 100 Å grain size, after magnification of 177,000 time.

FIG. 1B is a cross-sectional TEM micrograph of a poly-Si film having an approximately 1 $\mu$m grain size, after a magnification of 130,000 times.

FIG. 2 is an absorption spectra of microcrystalline silicon films of various grain sizes obtained by solid phase crystallization (SPC).

FIG. 3 is a graph plotting the square root of the absorption coefficient versus photon energies for different grain sizes.

FIG. 4 is a normalized Raman spectra for different grain sizes, with the spectrum only for the a-Si precursor smoothed by curve fitting before plotting.

FIG. 5 is a graph of ultra-violet (UV reflectance) for fully crystallized films obtained by annealing at 600° C. in 10 minutes (Example 2) and 5 minutes (Example 3) after surface treatments with Pallamerse and nickel-chloride solutions, respectively.

FIG. 6 is a Raman Spectra of films crystallized in Example 2 and Example 3.

FIG. 7 illustrates a shift of first order Raman peak for SPC poly-Si films versus the precursor deposition temperature.

FIG. 8A illustrates a graph of the dark conductivity of SPC poly-Si films crystallized from precursors deposited at various temperatures which were P-implanted prior to crystallization.

FIG. 8B illustrates a graph of the activation energy (for dark conductivity) of SPC poly-Si films crystallized from precursors deposited at various temperatures, which were P-implanted prior to crystallization.

FIG. 9 illustrates an XRD pattern for microcrystalline silicon ($\mu$c-Si) films of various grains sizes.

DETAILED DESCRIPTION OF THE DRAWINGS

Before proceeding with a detailed description of the first embodiment of the present invention, a brief description of the various theories related to the optical absorption properties of thin poly-Si films is useful. In 1974, Kuhl et al. (J.Electrochem.Soc., 121, 1496 (1974)) reported that the absorption coefficient of ambient-pressure CVD (chemical vapor deposition) poly-Si deposited at 680° C. is markedly higher than that of epitaxial silicon grown on sapphire at 1050° C. at photon energies from 1 to 4 eV. In 1981, Veprek et al. (J. Phys. C, 14, 295 (1981)) reported an anomalously high optical absorption for poly-Si films deposited at about 300° C., which exceeds even that of a-Si for photon energies between 0.5 and 2.5 eV. Other authors have also observed enhanced absorption in nanocrystalline silicon (nc-Si). In particular, Richter et al. (J. Appl. Phys., 52, 7281 (1981)) point out that the enhanced absorption cannot be simply in terms of a relaxation of the crystal momentum conservation. For the confinement size encountered therein (i.e., grain size ranging between 25 and 250 Å), the uncertainty introduced in the k-vector space is only a few percent of the k-vector change required for optical transitions to occur and, thus, the probability of a direct transition is very limited. On the other hand, Iqbal et al. (J. Phys. C, 16, 2005 (1983)) has reported that the dominant contribution to the measured enhanced absorption was due to diffuse light scattering (i.e., from strained regions and grain boundaries) and absorption in the films. However, Beck et al. (J. Non-Cryst. Solids, 198–200, 903 (1996)) have shown that light scattering can be excluded from a dominant role.

It has been found that the grain size influences the optical absorption of nanocrystalline (nc-Si) films, which were prepared using solid phase crystallization (SPC). A controllable approach to grain size determination was found to be possible through the use of metal-catalyzed (also referred to as metal-induced) crystallization. It was determined that different metal catalysts can be used to controllably obtain different grain sizes. For grain sizes below a threshold range, significant absorption enhancement can be seen in the photon energy range of about 1 to 3 eV.

EXAMPLE 1

Polycrystalline Si (poly-Si) films of various grain sizes (i.e., 100 Å, 1500 Å, 1 $\mu$m) were prepared by solid phase crystallization (SPC) of the same a-Si film at 600° C. in a conventional furnace. Ultra-Violet (UV) reflectance and XRD were used to establish that the films were fully crystallized. The microstructure of the films was then studied through a transmission electron microscope (TEM). The precursor amorphous film (a-Si) was deposited on Corning 7059 glass substrate at a temperature of about 210° C. through the use of plasma enhanced chemical vapor deposition (PECVD). The largest grain size film was obtained by simple annealing at a temperature of 600° C. in a nitrogen (N$_2$) gas ambient, after cleaning and a native oxide etch in a buffer oxide etch (BOE). Full crystallization of the film took 24 hours, and annealing was carried out to 30 hours.

Metal-catalyzed crystallization was employed to reduce and control the grain size for the other two films. Ultra-thin layers of nickel (Ni) and palladium (Pd) (e.g., the catalyst elements) were deposited on the surface of the films by thermal evaporation in a vacuum chamber. Samples with two different nominal thickness of the metals were prepared, i.e., thickness of about 10 Å and 30 Å. After cleaning, the native oxide of these samples was etched by buffered oxide etching (BOE), prior to loading them into the vacuum chamber for the metal exposures. The metal-treated films were fully crystallized at about 600° C. in approximately 10 minutes or less.

It is known that certain metals catalyze SPC of a-Si by modifying the crystallization kinetics and significantly lowering the thermal budget of the process (G. Liu and S. J. Fonash, J. Appl. Phys. Lett. 55, 660 (1989)). It has further been discovered by the applicants that the differences in grain size are a direct consequence of the nucleation and grain growth. Increasing nucleation sites or rates decrease the grain size, while increasing the grain growth rate increases the grain size. The palladium and nickel treated films in this example were found to crystallize into films having grain sizes of approximately 100 Å and 1500 Å, respectively. To ensure full crystallinity and similar annealing history for the films, all metal treated films were also annealed for 30 hours.

The optical absorption coefficient for each film was deduced from the transmission and reflectance data. It was determined that the thickness of the deposited metal did not alter the transmission or reflectance of the crystallized films. This indicates that the enhanced absorption observed from the smallest grain size film did not result from any silicide forming at the metal treated surface upon annealing. In fact, the sample was also treated with BOE to etch off any possible silicide, and no difference was observed in transmission or reflectance.

The Pd-catalyzed crystallized film had a microstructure having equiaxed grains with an average diameter of 100 Å, as shown in FIG. 1A. Even though Pd was only in contact with the surface of the film, the grain size was uniform throughout the thickness of the film. The crystallization is assumed to have started at the top surface with the formation of small grains and then propagated towards the substrate with homogenous kinetics. Similar observations were made on the microstructure of the Ni-catalyzed crystallized film with the exception of larger (e.g., about 1500 Å) and more dendritic-like grains. On the other hand, for the film whose surface was not treated with any metal, the grains were found to extend down the thickness of the film having dendritic-like grains with an average lateral size of 1 $\mu$m, as shown in FIG. 1B.

Referring to FIG. 2, the absorption spectra of the films indicate enhanced absorption for the 100 Å grain size film of Example 1. As is also seen for plasma deposited $\mu$c-Si films, this enhancement occurs in the photon energy range of about 1 to 3.5 eV, where optical transitions are expected to be dominantly indirect and phonon assisted. On the other hand, the films with about 1 $\mu$m and 1500 Å grain sizes show absorption characteristics very close to single crystalline silicon. This implies the existence of a threshold grain size necessary to have enhanced absorption. Thus, optical absorption enhancement is related to grain size.

Referring to FIG. 3, the absorption coefficient for all of $\mu$c-Si films of Example 1 may be fit (from about 1 to 2 eV) into the standard relation $K(E-E_g \mp E_{ph})^2$, which holds for an indirect-gap semiconductor. $E_g$ represents the bandgap, $E_{ph}$ is the effective phonon energy emitted or absorbed during an indirect transition, and K is a constant. As shown in FIG. 3, the slope of the lines are equal to $\sqrt{K}$. Thus, K is found to be largest for the 100 Å grain size film, while it does not differ much between the 1 μm and 1500 Å films.

According to the basic theory of indirect transitions, K is proportional to phonon absorption or an emission rate of the electron, while it undergoes a band-to-band transition. Thus, K can change due to changes in the matrix element that represents the electron-phonon interaction for the transition, and due to changes in the phonon density of states. Phonon mode density changes may also play a role. However, no experimental evidence has been found regarding the density of phonon modes in microcrystalline materials.

While electron or phonon confinement effects may cause the matrix element to change, there is clear evidence regarding the impact of confinement on phonons. This evidence is seen in another effect encountered in poly-Si as grain size decreases, particularly the fact that a shift and broadening of the first order Raman signal occurs with decreasing grain sizes. This first order phonon signal is a sharp peak at about 520 cm$^{-1}$ for single crystal Si and is a signature of the interaction of a photon with a TO phonon of K≈0. As shown in FIG. 4, this peak broadens and shifts for the 100 Å grain size film described in Example 1, while the width of the signals for the 1500 Å and 1 μm grain size films remain the same.

In 1981, Richter et al. (Solid State Communication 49, 625 (1981)) explained the downshift and broadening of the first order Raman peak in terms of relaxation in the k-vector selection rule, which result from a spread or uncertainty in the wave vector of the TO phonons introduced by spatial confinement in the grains. The fact that both enhanced absorption and Raman peak broadening is evidenced only for the 100 Å grain size film indicates that the origin of both effects is of the same nature, i.e., spatial localization of phonons. However, unlike in the case of Raman scattering, the phonons of interest in band-to-band optical absorption are TA ones. On the other hand, localization of acoustic phonons in at least a-Si was also evidenced by several authors (J. R. Orbach of Non-crystalline Solids 164–166, 917 (1993) and A. J. Scholten et al. Of Non-crystalline Solids 164–166, 923 (1993)). The broadening of acoustic Brillouin peaks in a-Si has also been reported by E. Bustarret et al. (Non-crystalline Solids 164–166, 923 (1993)).

Even though electron confinement is not severe enough to allow direct optical transitions in microcrystalline silicon (μc-Si), crystallite size effects may alter the rate of indirect transitions and lead to enhanced absorption. Due to phonon localization or electron localization, the matrix element representing the phonon-electron interaction is modified, such that a broader range of phonon wave vectors is allowed for an indirect transition to occur. As a result, more phonons become available to assist the transition, thereby increasing the transition rate. Thus, grain size is an important parameter for controlling the level of enhanced absorption.

Through the light absorption enhancement methods of the present invention, the efficiency of thin film poly-Si photovoltaic devices may be increased by tailoring optical absorption behavior of the thin film absorber. In particular, this enhancement caused by the fine grain structure can be obtained through the creation of a poly-Si film with an average grain size of about 100 Å using the metal-catalyzed SPC technique.

Recently, it has been shown that metal-catalyzed SPC of a-Si films may be achieved using surface treatments with metal-containing solutions, which is described in an article by the applicants (J. Electrochem. Soc., 144, L297 (1997)).

This solution-based approach ("solution treatment") can be used in lieu of vacuum treatment to achieve a higher production rate and at lower cost. Grain size control may still be accomplished using vacuum surface treatment, since the UV reflectance and Raman shift signals for the crystallized films are independent of whether the SPC-enhancing metal is applied by vacuum or solution. However, the characterization results do differ according to the metal applied. Thus, the solution-based technique may be used for the purpose of light absorption enhancement. This technique basically includes the step of treating an a-Si film surface by exposing the surface to metal-containing solutions in an atmospheric ambient, e.g., a solution containing the catalyst element. Two examples of metal-catalyzed SPC non-vacuum treatments are provided below in Example 2 and Example 3. In both examples, a precursor a-Si:H film was deposited from hydrogen diluted silane (i.e., $SiH_4:H_2$) at a temperature of about 210° C. on a glass substrate by plasma enhanced chemical vapor deposition (PECVD). After cleaning, the native oxide of each sample was etched in a buffered oxide etch (BOE), prior to applying the metal-containing solution. Annealing was then performed in a rapid thermal annealing (RTA) chamber at about 600° C. in an $N_2$ ambient. The crystallinity was examined and checked through UV reflectance and Raman scattering measurements.

EXAMPLE 2

A precursor (a-Si:H) film surface was wetted with a solution of potassium dinitrosulfate palladium (II) (i.e., $K_2(Pd(NO_2)_2SO_4)$) at room temperature. The solution is manufactured by Technic, Inc., Rhode Island under the trade name "Pallamerse" (hereinafter "the Pallamerse solution"). The Pallamerse solution concentration was about 37.75 grams/liter. After 5 minutes, the a-Si:H surface was rinsed with de-ionized water. A number of samples was prepared with the above procedure.

The samples were then annealed for 5, 10 and 15 minutes, respectively. A plot of reflectance versus wavelength is provided for the film annealed for 10 minutes, as shown in FIG. 5. The peak at 275 nm identifies the film as crystalline Si (T. Kammins, Polycrystalline Silicon for IC Applications, p. 68, Klumer Academic Publishers (1988)). When full crystallinity is achieved, the reflectance does not change with any further annealing. The reflectance signal for the samples annealed for 10 and 15 minutes appeared identical. Thus, it was concluded that crystallization was complete in 10 minutes or less. By contrast, with no surface treatment, crystallization of the same a-Si:H precursor film required 18 hours at the same annealing temperature (i.e., about 600° C.).

EXAMPLE 3

The same procedure as described in Example 2 was repeated with a nickel-chloride (NiCl) solution, which contained about 5% nitric acid and about 1 gram/liter of nickel (Ni). However, no matter how long the exposure was carried out (e.g., from 5 minutes to 1 day), the films were found not to show any crystallization for up to 20 minutes of annealing. It was discovered that Ni is more stable in the solution (as $Ni^{++}$ ions with $Cl^-$ ions) and was not attaching to the a-Si surface. Thus, in order to precipitate Ni onto the surface of the film, the sample was placed on a hot plate at a temperature of about 200° C., and the solution was then applied to the film. Since the film was maintained close to about 200° C., the droplets of the NiCl solution quickly evaporated, thereby leaving Ni precipitates on the surface of the a-Si:H film. Thereafter, the film was found to crystallize in 5 minutes or less. The reflectance of the film after 5 minutes of annealing is shown in FIG. 5.

Referring to FIG. 6, there is provided Raman spectra of the films crystallized through the solution-based procedures described above in Examples 2 and 3. As shown in FIG. 6, the TO band at about 480 cm$^{-1}$ due to amorphous phase does not exist for both of the films of Examples 2 and 3. The peak at about 520 cm$^{-1}$ (which indicates the crystalline phase) is broader for the film whose surface was treated with the Pd-containing solution (e.g., the Pallamerse solution). As with vacuum treatments, this is due to smaller grain sizes when Pd is used, and is independent of how metal treatment is accomplished. That is, Pd provides the same results whether applied by vacuum deposition or by exposure to solution.

The fact that Ni induces more discernible reflectance peaks at 275 nm and 365 nm than Pd (as shown in FIG. 5) is the same for metal treatments performed in a vacuum by evaporation. These peaks are affected by distortions in the crystal structure, e.g., grain boundaries and intra-grain defects (T. Kammis, Polycrystalline Silicon for IC Applications, p. 68 Klumer Academic Publishers (1988)). The reflectance peak at about 400 nm for the Ni-catalyzed crystallized film is due to interference of reflectance from the film surface and glass-film interface. Even though the Pd-catalyzed crystallized film is of the same thickness (i.e., about 1000 Å), the same interference peak is hardly observable. The underlying reason is that the intensity of the light reflected from the film-glass interface is further reduced due to higher optical absorption of the film (as also obtained by vacuum treatment).

Referring to FIG. 9, there is provided an x-ray detraction (XRD) pattern for microcrystalline silicon ($\mu$c-Si) films of various grain sizes, i.e., 1 $\mu$m, 1500 Å and 100 Å. As shown in FIG. 2, there is significant absorption enhancement by a microcrystalline film, which is 100% crystalline (e.g., no a-Si content). This enhancement was tailored according to grain size modification. In this example, varying grain sizes were used to show that smaller grain size films (e.g., about 100 Å) had significantly stronger absorption properties, than larger grain size film (e.g., 1 $\mu$m), which was crystallized from the same amorphous precursor film.

Although the above describes preferred methods for selectively controlling the grain size (or crystal size) of crystalline films and, thus, the optical absorption properties of the crystalline films, various alternatives and modifications can be devised to accomplish the same. For example, the solution (containing the catalyst element) may be applied either to the a-Si film or the substrate, through the use of a variety of techniques, such as ultrasonic bath, spraying, immersing, or spin coating. Other catalyst elements (e.g., nucleating site materials) may also be selected instead of Pd and Ni. The word "containing" (e.g., metal-containing solution) used herein may be understood as the catalyst element itself or its compound (e.g., compound including that element), which is dispersed or dissolved in a solution (e.g., a dispersion of the catalyst element or an ionic solution of the catalyst element or a compound of the catalyst element). As a solution, various aqueous solutions and organic solvent solutions can be used. Those solvents can be roughly classified into a polar solvent and a non-polar solvent. Furthermore, the surface of the a-Si film may also be treated with the catalyst element by coating the surface of the film with an oxide containing the catalyst element. For example, a liquid precursor material for forming silicon oxide (which contains the metal catalyst or its compound) may be coated on the a-Si film surface and then solidified through baking ("oxide coating"), an example of which is provided in U.S. Pat. No. 5,585,291.

The optical absorption enhancement is attributed to the confinement effect, which occurs below a threshold grain size, e.g., approximately 200 Å. Thus, the grain size may be controlled below this limit through the use of alternative approaches or methodologies than those described above. For instance, rapid thermal annealing (RTA) at very high temperatures may be employed to obtain crystalline Si films with grain sizes below this limit (X. Zhao et al., J. Phys. D, 27m 1575 (1994)). Plasma enhanced chemical vapor deposition (PECVD) may also be employed to obtain nanocrystalline (nc-Si) films with grain sizes below this limit at deposition substrate temperatures below 300° C. (J. Meier et al., Mat. Res. Soc. Symp. Proc., 420, 3 (1996)). It is preferred that the grain size is approximately about 60 Å to about 200 Å, since the bandgap seems to increase below about 60 Å and may negatively impact the electrical properties of the film.

It has been found that acoustic phonon localization is a possible cause of enhanced light absorption in crystalline films. Thus, techniques other than grain size control can be introduced to achieve this goal by phonon confinement. Tiong et al. (K. K. Tiong et al., Appl. Phys. Lett., 44, 122 (1984)) have observed phonon localization in As$^+$ implanted GaAs and attributed this to k-vector relaxation induced by the implantation damage. In fact, through experimentation, applicants have observed light absorption enhancement in SPC poly-Si films, after an ion implantation process at a dose as low as about $10^{12}$ cm$^{-2}$. Thus, this light absorption enhancement can also be used to increase the efficiency of thin film poly-Si photovoltaic devices as long as the implantation damage is preferably held below approximately $10^{15}$ cm$^{-3}$ to prevent deterioration of the electrical transport.

Turning to the second embodiment of the present invention, there is provided a method for selectively controlling and adjusting mechanical properties, particularly stress formation levels during formation of poly-Si films.

Stress formations have been found to occur in thin film Si. For example, in SPC, stress formation results from volumetric contraction of the a-Si film, during transformation from an amorphous phase into a crystalline phase. This contraction is resisted by the substrate, which imposes a tensile stress on the film. This results in the broadening of atomic distances and the altering of energies of vibrational modes. Thus, the first order Raman peak (e.g., located at about 520 cm$^{-1}$ at neutral stress level) shifts to lower energies (wavenumbers).

FIG. 7 illustrates the location of first order Raman peaks for SPC poly-Si films that are crystallized from amorphous precursors deposited at various temperatures, i.e., 130, 170, 210, 250 and 290° C. The precursors were deposited to 1000 Å thickness from hydrogen diluted silane. It was found that stress levels may be reduced as the precursor deposition temperature is lowered. The decrease in stress level is attributed to an increase in a void density of the precursor films as their deposition temperature is lowered. The voids act as stress relievers to reduce resistance between the crystallizing a-Si film and the substrate. It has also been discovered that a lower level of stress was obtained for films crystallized using RTA, as inferred from the Raman peak positions. To better explain this concept, Table I is provided below to illustrate the first order Raman peak positions for SPC poly-Si films indicative of different stress levels.

TABLE I

| Thickness (Å) | Process | Raman Peak (cm$^{-1}$) |
| --- | --- | --- |
| 1000 | Furnace, 600° C. | 518.4 |
| 1000 | RTA, 700° C. | 520.3 |
| 1000 | Furnace, 600° C., Ni catalyst | 519.7 |
| 5000 | Furnace, 600° C. | 518 |
| 5000 | Furnace, 600° C., Ni catalyst | 519 |
| 5000 | Furnace, 600° C., Pd catalyst | 516 |

As shown in Table I, the stress levels of 1000 Å thick films are compared in the first and second rows, which correspond to furnace annealing and RTA, respectively. For all cases, the precursors were a-Si films deposited from Argon (Ar) diluted Silane at about 210° C. As shown, a lower level of tensile stress is induced for the RTA case. The reduction in stress is attributed to the softening of Corning 7059 glass substrate on which the films were deposited. Once the substrate is softened, it does not resist the volumetric contraction of the crystallizing film and, thus, prevents or reduces stress formations. Corning 7059 glass was found to soften at annealing temperatures above about 600° C. In fact, the samples annealed at about 700° C. were deformed slightly concave up, which indicates tensile stress. Since the annealing was carried out only for 4 min, this exposure is short enough to avoid melting the substrate. However, to avoid substrate deformation and stress at the same time, the substrate surface on which the a-Si film is to be deposited may first be coated with a spin on glass, which softens or melts at SPC annealing temperatures, i.e., at temperatures below the softening temperature of the substrate. Instead of spin on glass, a thin glass layer may be coated on the substrate surface using sputtering or evaporation, so long as the softening temperature of the glass layer is lower than the annealing temperature, e.g., lower than the softening temperature of the substrate.

Referring to the third row of Table I, it is shown that stress reduction may also be obtained if the precursor film surface is treated with Ni before crystallization. However, an increase in tensile stress is observed upon the increase of film thickness, as shown in the fourth row of Table I. Again, by surface treatment with Ni, stress formation levels can be reduced for thicker films, as shown in the fifth row. Finally, as indicated in the last row, unlike with Ni, the effect of Pd surface treatment is to increase stress levels.

Accordingly, the second embodiment of the present invention provides a variety of approaches to control the mechanical properties, particularly stress formation levels in SPC poly-Si films. Stress formation levels may be controlled and adjusted during crystallization in the following manners:

(i) the selection of a precursor deposition temperature to control void density in the precursor film;

(ii) the use of an interface coating between the substrate and the film which softens or melts at SPC annealing temperatures, i.e., below the softening temperature of the substrate;

(iii) the use of metal catalyst surface treatments, particularly the selection of the catalyst; and (iv) the selection of the film thickness of the a-Si precursor.

Since methods (ii) and (iii) may be applied to selective regions in thin film poly-Si, stress levels can be selectively controlled and adjusted in a poly-Si film.

Another problem associated with stress is its impact on the electrical properties of the poly-Si film. That is, stress leads to the formation of structural defects, such as dislocations and stacking faults, which result in dangling bonds. The dangling bonds trap free carriers and destroy the electronic quality of the material.

Poly-Si thin films are conventionally obtained by plasma deposition, solid phase crystallization (SPC), or liquid phase crystallization. Plasma deposition of thin film poly-Si yields a low density of defects due to in situ hydrogen passivation during the process. However, poly-Si films deposited by plasma deposition were found to posses smaller grain sizes and certain amorphous content, which limit the carrier mobility (J. Meier et al, Mat. Res. Soc. Symp. Proc., 420, 3 (1996)). Unlike for amorphous Si films, the deposition rate for poly-Si films is very low. Although SPC yields the largest grain sizes and the highest crystallinity, the presence of high densities of intra-grain defects in SPC poly-Si limits its use. The intra-grain defects can be passivated by a hydrogen plasma exposure after crystallization; however, post hydrogenation was found to lead to electronic instability (V. Sunthatalingam et al., Appl. Phys. Lett., 68, 1400 (1996)).

In a third embodiment, there is provided a method for controllably adjusting stress formation levels to influence electrical properties of poly-Si films. It has been found that the intra-grain defect formation correlates with the mechanical stress induced during the SPC process and is observed to be more severe with thicker films. Thus, minimization of stress formation levels during SPC is required to optimize the formation of intra-grain defects. Furthermore, mechanical stress is also a major problem confronted in MEMS (Micro ElectroMechanical Systems) and must be minimized.

To investigate the effect of stress on the doping efficiency of poly-Si films, various films were implanted with phosphorous (P) at a dose of about $4.0 \times 10^{14}$ cm$^{-2}$. The films were then crystallized at a conventional furnace at about 600° C. for 30 hours as well as by RTA for 4 minutes at about 700° C. The a-Si precursor films used herein are from the same matrix as used above, i.e., deposited at temperatures of 130, 170, 210, 250 and 290° C. Among this matrix of a-Si films, the highest photoconductivity was recorded from the a-Si film deposited at 250° C. This is typical for PECVD deposited a-Si films, in which the optimum electrical properties are obtained for a deposition temperature of about 250° C. However, once the a-Si films were crystallized, the precursor deposited at about 130° C. was found to yield the best poly-Si film.

FIGS. 8A and 8B illustrate the dark conductivities and activation energies for the dark conductivity for the crystallized films, respectively. From FIGS. 7, 8A and 8B, it is clear that the doping efficiency and the electrical quality of poly-Si films may be optimized by lowering stress levels during formation of the poly-Si films. It is also clear that the doping efficiency of the films are higher when RTA is employed. The enhancement in the electrical properties is due to the lower level of stress introduced by the softening of substrate (as described above).

Accordingly, the stress formation levels may be controlled in SPC poly-Si films through the use of the above described methods of the present invention so as to reduce significantly defect generation in these films. In this way, improved electronic quality poly-Si may be achieved for device applications with higher doping efficiencies, higher carrier mobility, better control of the Fermi level and longer minority carrier lifetimes.

In summary, the present invention provides various methods for controllably adjusting or tailoring the nanostructure of crystalline films to control their material properties. The present invention may be used to produce thin poly-Si film with desired material properties (e.g., optical, mechanical and electrical properties) which may be applied in a variety of technologies and devices to enhance their operating characteristics. For instance, large area, low cost poly-Si solar cells may be fabricated with higher conversion efficiency and stability, than their a-Si counterparts. Poly-Si thin film transistors may also be produced with rapid switching characteristics and high on-current (high mobility) as well as low off leakage current (lower defect density). Poly-Si layers may be produced for 3-D microelectronics, e.g., layers on top of wafers in which thin film transistors can be made. MEMS using beam structures, diaphragms, etc. may be fabricated, with the performance of the device depending significantly on the initial stress state of the poly-Si.

The invention having thus been described with particular reference to the preferred forms thereof, it will be obvious that various changes and modifications may be made therein without departing from the spirit and scope of the invention as defined in the appended claims.

We claim:

1. A method for enhancing optical absorption characteristics of a semiconductor film, comprising the steps of:

contacting at least a portion of an amorphous semiconductor film with a nucleating site material that is chosen to provide a predominance of grain sizes that are less than about 200 Angstroms, after an annealing of said amorphous film; and subjecting said amorphous silicon film to an annealing process, whereby said portion of said amorphous semiconductor film is converted to a crystalline film having a predominance of said grain sizes that are less than about 200 Angstroms.

2. The method as recited in claim 1, wherein said semiconductor is silicon.

3. The method as recited in claim 1, wherein said nucleating site material is a palladium.

4. A method for converting at least a portion of an amorphous semiconductor film to a crystallized state, said method providing reduced stress levels in said semiconductor film, said method comprising the steps of:

depositing an amorphous semiconductor film on a substrate at a temperature which assures as a result of said depositing a presence of voids in said film; and subjecting said amorphous semiconductor film to an annealing process to crystallize at least a portion of said amorphous silicon film, said voids present in said amorphous semiconductor film enabling stress relaxation in the crystallized portion.

5. The method as recited in claim 4, wherein said semiconductor is silicon.

6. A method for converting at least a portion of an amorphous semiconductor film to a crystallized state, said method assuring a reduced stress levels in said semiconductor film, said method comprising the steps of:

depositing an interface layer on a substrate, said interface layer having a glass transition temperature;

depositing an amorphous semiconductor film on said interface layer, said amorphous semiconductor film having a higher solid phase crystallization temperature than said glass transition temperature of said interface layer; and subjecting said amorphous semiconductor film and interface layer to an annealing process at a temperature that exceeds said glass transition temperature of said interface layer so as to soften said interface layer during said annealing, said annealing enabling a crystallization of at least a portion of said amorphous silicon film, while said interface layer enables a relaxation of strain therein.

7. The method as recited in claim 6, wherein said semiconductor is silicon.

8. The method as recited in claim 7 wherein said interface layer is a glass.

9. A method for crystallizing at least a portion of an amorphous semiconductor film to a crystallized state, and for further adjusting a level of residual tensile stress in said film comprising the steps of:

treating at least a portion of said amorphous semiconductor film with a nucleating site material that is chosen to cause a shift of the first order Raman peak of a resulting crystalline portion of said film, after being subjected to an annealing process; and subjecting said amorphous silicon film to an annealing process to crystallize said at least a portion of said amorphous silicon film, said shift of said Raman peak indicating an adjustment of the residual tensile stress in said portion of said film that is crystallized.

10. The method of claim 9, wherein said nucleating material is selected to cause an increase in said residual stress and a resulting decrease in wave number position of said Raman peak.

11. The method of claim 10, wherein said nucleating material is Palladium.

12. The method of claim 9, wherein said nucleating material is selected to cause a decrease in said residual stress and a resulting increase in wave number position of said Raman peak.

13. The method of claim 12, wherein said nucleating material is Nickel.

14. A method for enhancing optical absorption properties of a crystalline silicon film, comprising the steps of:

providing said crystalline silicon film on a substrate;

implanting ions in said crystalline silicon film to influence the optical absorption properties of said film, said implanting controlled to assure that species are implanted in said film at a dose to assure continued crystallinity of said film, said dose in excess of about $10^{12}/cm^2$ but less than about $10^{15}/cm^2$.

* * * * *